United States Patent
Shimizu

(10) Patent No.: US 7,924,016 B2
(45) Date of Patent: Apr. 12, 2011

(54) VOLTAGE MEASURING DEVICE

(75) Inventor: Hidehiko Shimizu, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 667 days.

(21) Appl. No.: 11/790,334

(22) Filed: Apr. 25, 2007

(65) Prior Publication Data

US 2008/0265901 A1   Oct. 30, 2008

(30) Foreign Application Priority Data

May 1, 2006   (JP) ................................. 2006-127272

(51) Int. Cl.
*G01N 27/416* (2006.01)

(52) U.S. Cl. .......................... 324/434; 320/163; 320/166

(58) Field of Classification Search .................. 320/166, 320/163, 103; 324/434
See application file for complete search history.

(56) References Cited

U.S. PATENT DOCUMENTS

| | | | | |
|---|---|---|---|---|
| 6,362,627 | B1 * | 3/2002 | Shimamoto et al. | 324/434 |
| 6,639,408 | B2 * | 10/2003 | Yudahira et al. | 324/434 |
| 7,126,342 | B2 * | 10/2006 | Iwabuchi et al. | 324/426 |
| 7,129,714 | B2 * | 10/2006 | Baxter | 324/678 |

FOREIGN PATENT DOCUMENTS

| | | |
|---|---|---|
| JP | 11-248755 | 9/1999 |
| JP | 2003-84015 | 3/2003 |

* cited by examiner

*Primary Examiner* — Edward Tso
*Assistant Examiner* — Aaron Piggush
(74) *Attorney, Agent, or Firm* — Kratz, Quintos & Hanson, LLP

(57) ABSTRACT

A pair of measuring switches S21, S22 is interposed between both terminals of a capacitor C, and inputs T1, T2 of A/D converters 11c, 11d via resistors R1, R2. A pair of measuring switches S23, S24 is interposed between both inputs T1, T2 and a ground. The CPU 12a controls the measuring switches S21 to S24 so that when a terminal "a" of the capacitor C is positive charged, while the other terminal "b" of the capacitor C is grounded, both terminals "a" and "b" are respectively connected to the inputs T1 and T2. The CPU 12a controls the measuring switches S21 to S24 so that when the terminal "b" of the capacitor C is positive charged, while the terminal "a" of the capacitor C is grounded, both terminals "a" and "b" are respectively connected to the inputs T1 and T2.

7 Claims, 9 Drawing Sheets

VOLTAGE MEASURING DEVICE

CROSS REFERENCE TO RELATED APPLICATIONS

This application is on the basis of Japanese Patent Application No. 2006-127272, the contents of which are hereby incorporated by reference.

BACKGROUND OF THE INVENTION

1. Field of the Invention

The present invention relates to a voltage measuring device for measuring a voltage across each of unit cells connected in series and composing an assembled battery.

2. Description of the related art

These days, a hybrid electric vehicle (hereunder referred to as "HEV") using an electric motor together with an engine becomes widely used. This HEV includes a low voltage battery such as 12 V for starting the engine, and a high voltage battery for driving the electric motor. The high voltage battery obtains a high voltage by a plurality of unit cells connecting in series. The unit cell is a secondary battery such as a nickel hydride battery or a lithium battery.

The voltage across each unit cell, namely, a state of charge (SOC) of the high voltage battery is varied while repeating charge and discharge. In the event of charge and discharge of the battery, from a viewpoint of durability of each unit cell and a viewpoint of security, it is necessary to restrict the charge when the unit cell having the highest SOC reaches an upper limit SOC (or upper limit voltage), and to restrict the discharge when the unit cell having the lowest SOC reaches a lower limit SOC (or lower limit voltage).

Accordingly, when the unit cells are varied, substantially, a usable capacity of the battery is reduced. Therefore, in the HEV, so called assisting-regenerating system works insufficient, so that a vehicle performance and a mileage are reduced. According to the assisting-regenerating system, the electric motor using the battery assists the engine when a vehicle goes up a hill, and the battery is charged when the vehicle goes down the hill. Accordingly, for equalizing the SOCs of the unit cells, measuring the voltage across each unit cell is needed.

Conventionally, a device shown in FIG. 10 is disclosed as a voltage measuring device 10 for measuring a voltage across each unit cell composing a high voltage battery (for example, see Patent Document 1). In FIG. 10, a reference mark $B_H$ indicates a high voltage battery. The high voltage battery $B_H$ is used as a power source for an electric motor M of the HEV. The electric motor M is connected to both ends of the high voltage battery $B_H$ as needed. Further, an alternator (not shown) as a battery charger is connected to the both ends of the high voltage battery $B_H$ as needed. The high voltage battery $B_H$ is composed of, for example, five unit cells C1 to C5 each of which is a secondary battery.

The voltage measuring device 10 includes a capacitor C sequentially connected to the unit cells C1 to C5, and a plurality of selector switches S1 to S16 for sequentially connecting the unit cells C1 to C5 to both ends of the capacitor C.

The six selector switches S11 to S16 are provided against the five unit cells C11 to C5. Namely, for example, an anode of the unit cell C1 and a cathode of the unit cell C2 connected to the anode of the unit cell C1 are connected to the capacitor C via a common selector switch S12. As shown in FIG. 10, using the common selector switches S12 to S15 reduces the number of the selector switches.

The voltage measuring device 10 also includes a voltage measuring circuit 11 for measuring a voltage across the capacitor C, and a pair of switches S21 and S22 respectively provided between one end of the capacitor C and an input terminal T1 of the voltage measuring circuit 11, and between the other end of the capacitor C and an input terminal T2 of the voltage measuring circuit 11. The voltage measuring circuit 11 works with a low voltage battery (not shown) electrically isolated from the high voltage battery $B_H$. The voltage measuring circuit 11 is composed of a differential amplifier 11a for outputting a difference between voltages inputted from the input terminals T1 and T2, and an A/D converter 11b for converting an analog output from the differential amplifier 11a to a digital signal.

An operation of the voltage measuring device 10 will be explained below. Switches S11 to S16, S21, and S22 are normally off. From this condition, when the selector switches S11 and S12 are on, a voltage across the unit cell 1 is charged to the capacitor C. Next, after the selector switches S11 and S12 are off, the measuring switches S21 and S22 are on, then the both ends of the capacitor C are connected to the input terminals T1 and T2 of the voltage measuring circuit 11.

Then, the differential amplifier 11a in the voltage measuring circuit 11 supplies a voltage across the capacitor C to the A/D converter 11b. The A/D converter 11b converts the voltage across the capacitor C to measure the voltage as a voltage across the unit cell C1. Similarly, the selector switches S12 to S16 are sequentially on, and the voltages across the unit cells C2 to C5 are sequentially measured. Because the selector switches S11 to S16 and the measuring switches S21 and S22 are not simultaneously on, the high voltage battery $B_H$ is electrically isolated from the voltage measuring circuit 11 while measuring the voltage.

Incidentally, in the voltage measuring device 10 shown in FIG. 10, when the unit cells having odd numbers C1, C3, C5 is connected to the capacitor C, an one terminal "a" of the capacitor is plus charged, and the other terminal "b" is minus charged. On the other hand, when the unit cells having even numbers C2, C4 are connected to the capacitor C, the other terminal "b" is plus charged, and the one terminal "a" is minus charged. Accordingly, the capacitor C is inversely charged depending on the connected unit cells C1 to C5.

Therefore, conventionally, for measuring the voltage across the capacitor charged inversely, a bipolar input A/D converter 11b is used, and a polarity output of the A/D converter 11b is ignored. Alternatively, an absolute value circuit is provided between the differential amplifier 11a and the A/D converter 11b. However, in the conventional voltage measuring device 10, a complex and expensive component such as the bipolar input A/D converter or the absolute value circuit is required, therefore the conventional voltage measuring device 10 costs high.

Therefore, as shown in FIG. 11, reversing switches S23 and S24 are added to the measuring switches S21 and S22. Thus, for always connecting an anode of the capacitor C to the input terminal T1, and always connecting a cathode of the capacitor C to the input terminal T2, the measuring switches S21, S22 and the reversing switches S23, 24 are on/off controlled.

In the voltage measuring device 10, an upper level cell is charged higher voltage. For example, when each of unit cells C1 to C5 is charged 12V, the voltage of the anode of the uppermost cell C1 is 60V (=12V*5), and the voltage of the cathode of the uppermost cell C1 is 48V (=12V*4). Accordingly, when the unit cell C1 charges the capacitor C, the voltage of the terminal "a" is 60V, and the voltage of the terminal "b" is 48V. Resultingly, 60V and 48V are respectively applied to the input terminals T1, T2 of the differential amplifier 11a. Therefore, high voltage switches for the high voltage battery $B_H$ should be used as the measuring switches S221, S22, and the reversing switches S23, S24, and the voltage measuring device 10 costs high.

Further, there is a problem that a break between the unit cells C1 to C5 and the capacitor C cannot be detected. For example, in FIG. 10, suppose that a break is occurred at T3. In that case, firstly, the unit cell C1 charges the capacitor C, next, the unit cell C2 charges the capacitor C. However, because the T3 is broken, the unit cell C2 cannot charge the capacitor C, and the voltage across the capacitor is a residual voltage charged by the unit cell C1.

For solving the problem, for example, according to the Patent Document 2, a series circuit composed of a discharge resistor and a reset switch parallel to the capacitor C is provided, and at every end of measuring the voltage across the capacitor C, the reset switch is on to discharge the capacitor C. By discharging the capacitor C at every measuring, if the break is occurred at T3, the voltage across the capacitor C after charged by the unit cell C2 is zero or a very small value, so that the break can be detected.

However, according to a method of the Patent Document 2, the reset switch is needed in addition to the switch for connecting the both terminals of the capacitor C and the voltage measuring circuit 11. Therefore, the voltage measuring device 10 costs high.

[Patent Document 1] Japanese Published Patent Application No. H11-248755

[Patent Document 2] Japanese Published Patent Application No. 2003-84015

According to the above, an object of the present invention is to provide a low-cost voltage measuring device for preventing a negative voltage from applying to a voltage measuring unit when a capacitor charged in positive and negative polarities depending on unit cells to be connected to the capacitor is connected to the voltage measuring unit, and for allowing a switch which is not a high voltage switch to be used as a switch between the capacitor and the voltage measuring unit.

SUMMARY OF THE INVENTION

In order to attain the object, according to the present invention, there is provided a voltage measuring device including:

a capacitor sequentially connected to a plurality of unit cells connected in series, and charged in positive and negative polarities depending on the unit cells;

a voltage measuring unit for measuring a voltage across the capacitor;

a pair of first switches of which first terminals are respectively connected to first and second terminals of the capacitor and second terminals of the first switches are connected to first and second input terminals of the voltage measuring unit;

a pair of second switches of which first terminals are respectively connected to the first and the second input terminals and second terminals of the second switches are connected to a ground;

a first switching controller for controlling the first and second switches so that when a first terminal of the capacitor is positive charged, while a second terminal of the capacitor is grounded, at least the first terminal of the capacitor is connected to one of the input terminals;

a second switching controller for controlling the first and second switches so that when the second terminal of the capacitor is positive charged, while the first terminal is grounded, at least the second terminal of the capacitor is connected to one of the input terminals.

According to the above, the plus charged first terminal of the capacitor is connected to the input terminal while the second terminal of the capacitor is grounded.

Preferably, the voltage measuring unit includes two input terminals, and two analog/digital converters for respectively analog/digital converting voltages inputted from the two input terminals, the first terminal of one of the first switches is connected to the first terminal of the capacitor, the second terminal of the one of the first switches is connected to a first input terminal, the first terminal of the other one of the first switches is connected to the second terminal of the capacitor, and the second terminal of the other one of the first switches is connected to a second input terminal.

According to the above, there is no need to change polarity of the capacitor for connecting to the input terminals, and switches for changing the polarity are not needed.

Preferably, the first switching controller controls the first and second switches so that while the second terminal of the capacitor is grounded, both terminals of the capacitor are respectively connected to the two input terminals, and the second switching controller controls the first and second switches so that while the first terminal of the capacitor is grounded, both terminals of the capacitor are respectively connected to the two input terminals. Further, the voltage measuring unit measures a difference by subtracting a voltage applied to the second input terminal from a voltage applied to the first input terminal as a voltage across the capacitor while the first switching control controls the first and the second switches, and measures a difference by subtracting a voltage applied to the first input terminal from a voltage applied to the second input terminal as a voltage across the capacitor while the second switching controller controls the first and the second switches.

According to the above, the voltage across the capacitor is correctly measured.

Preferably, the voltage measuring unit includes an analog/digital converter for analog/digital converting the voltage applied to the input terminal, the first terminals of the pair of the first switches are connected to the capacitor, the second terminals of the first switches are connected to a common input terminal of the voltage measuring unit, the first terminals of the second switches are respectively connected to the first and second terminals of the capacitor, and the second terminals of the second witches are connected to the ground.

According to the above, even if the analog/digital converter has only one input terminal, the plus charged terminal of the capacitor is connected to the input terminal owing to the first switches.

Preferably, the first switching controller controls the first and second switches so that while the second terminal of the capacitor is grounded, the first and second terminals of the capacitor are alternately connected to the input terminal, and the second switching controller controls the first and second switches so that while the first terminal of the capacitor is grounded, the first and second terminals of the capacitor are alternately connected to the input terminal. Further, the voltage measuring unit measures a differential voltage by subtracting a voltage applied to the input terminal while the second terminal of the capacitor is connected to the input terminal from a voltage applied to the input terminal while the first terminal of the capacitor is connected to the input terminal as a voltage across the capacitor while the first switching controller controls the first and the second switches, and measures a differential voltage by subtracting a voltage applied to the input terminal while the first terminal of the capacitor is connected to the input terminal from a voltage applied to the input terminal while the second terminal of the capacitor is connected to the input terminal as a voltage across the capacitor while the second switching controller controls the first and the second switches.

According to the above, the voltage across the capacitor is correctly measured.

Preferably, the first switching controller controls the first and second switches so that while the second terminal of the capacitor is grounded, the first terminal of the capacitor is connected to the input terminal, and the second switching controller controls the first and second switches so that while the first terminal of the capacitor is grounded, the second terminal of the capacitor is connected to the input terminal. Further, the voltage measuring unit measures a voltage applied to the input terminal while the first and second switching controllers control the switches as a voltage across the capacitor.

According to the above, it is not necessary to alternately connect the both terminals of the capacitor to the input terminal.

Preferably, the voltage measuring device further includes a third switching controller for controlling the first and second switches to discharge the capacitor by grounding the both terminals of the capacitor after the voltage measuring unit measures the voltage across the capacitor, and a failure detecting unit for detecting a failure based on the voltage across the capacitor measured by the voltage measuring unit.

According to the above, because the capacitor is discharged after measuring the voltage, the failure such as a break can be detected based on the voltage across the capacitor. Further, the switches for measuring the voltage across the capacitor are also used for discharging the capacitor.

These and other objects, features, and advantages of the present invention will become more apparent upon reading of the following detailed description along with the accompanied drawings.

DETAILED DESCRIPTION OF THE PREFERRED EMBODIMENTS

First Embodiment

Figure 1:
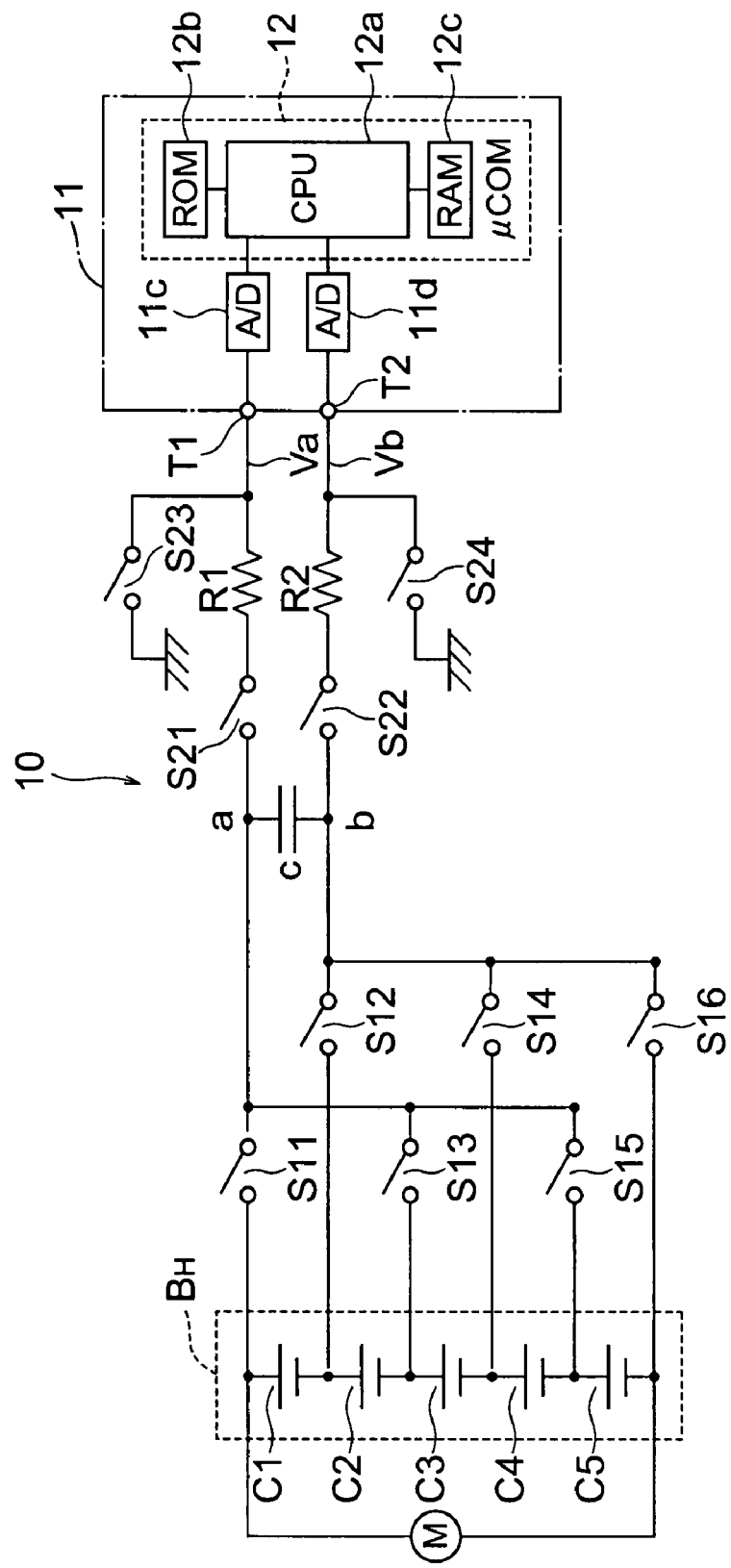
FIG. 1 is a circuit diagram showing a first embodiment of a voltage measuring device according to the present invention.

A voltage measuring device 10 according to a first embodiment of the present invention will be explained with reference to figures. FIG. 1 is a circuit diagram showing the voltage measuring device according to the first embodiment of the present invention. In FIG. 1, a reference mark $B_H$ indicates a high voltage battery. The high voltage battery $B_H$ is used as a battery for an electric motor M in an HEV. The electric motor M as a load and an alternator as a charger are connected to both ends of the high voltage battery $B_H$ as necessary. For example, five unit cells C1 to C5 composed of a single secondary battery form the high voltage battery $B_H$.

Incidentally, in the first embodiment, the unit cells C1 to C5 are composed of a single secondary battery. However, the number of the secondary battery may more than one. Further, the number of the unit cells is not limited to five.

The voltage measuring device 10 includes a capacitor for sequentially being charged by the five unit cells C1 to C5, and a plurality of selector switches S11 to S16 for sequentially connecting both terminals of the unit cells C1 to C5 to both terminals of the capacitor C.

Six selector switches S11 to S16 are provided against five unit cells C1 to C5. For example, a minus charged terminal of the unit cell C1 and a plus charged terminal of the unit cell C2 are connected to the capacitor C via a common selector switch S12.

Accordingly, in the voltage measuring device 10, when odd number unit cells C1, C3, C5 are connected to the capacitor C, a terminal "a" of the capacitor C is positive charged, and a terminal "b" of the capacitance C is negative charged. On the other hand, when even number unit cells C2, C4 are connected to the capacitor C, the terminal "b" is positive charged and the terminal "a" is negative charged. Namely, the polarity of the charged capacitor depends on the unit cells C1 to C5.

Further, the voltage measuring device 10 includes a voltage measuring unit 11 for measuring a voltage across the capacitor C, and a pair of measuring switches (first switches) interposed between the terminals "a", "b" of the capacitor C and resistors R1, R2. The measuring switch S21 is interposed between the terminal "a" of the capacitor C and the resistor R1, and the measuring switch S22 is interposed between the terminal "b" of the capacitor C and the resistor R2. The resistors R1, R2 are interposed between the measuring switches S21, S22 and inputs T1, T2 of the voltage measuring unit 11.

The voltage measuring device 10 also includes a pair of measuring switches S23, S24 (second switches) interposed between the resistors R1, R2 and a ground. The ground is ground for a low voltage battery.

The voltage measuring unit 11 includes two inputs T1, T2, two A/D converters 11c, 11d for converting the voltages inputted from the inputs T1, T2, and a microcomputer 12 (μCOM) connected to the A/D converters 11c, 11d.

The microcomputer 12 includes a CPU 12a, a ROM 12b for storing programs, and a RAM 12c having a working area and a data storing area.

The CPU 12a controls on/off operation of the selector switches S11 to S16, and the measuring switches S21 to S24. Incidentally, for example, a photo-MOS transistor is used as the selector and measuring switch. The switches are on/off controlled while electrically isolated from the CPU 12a.

Figure 2:
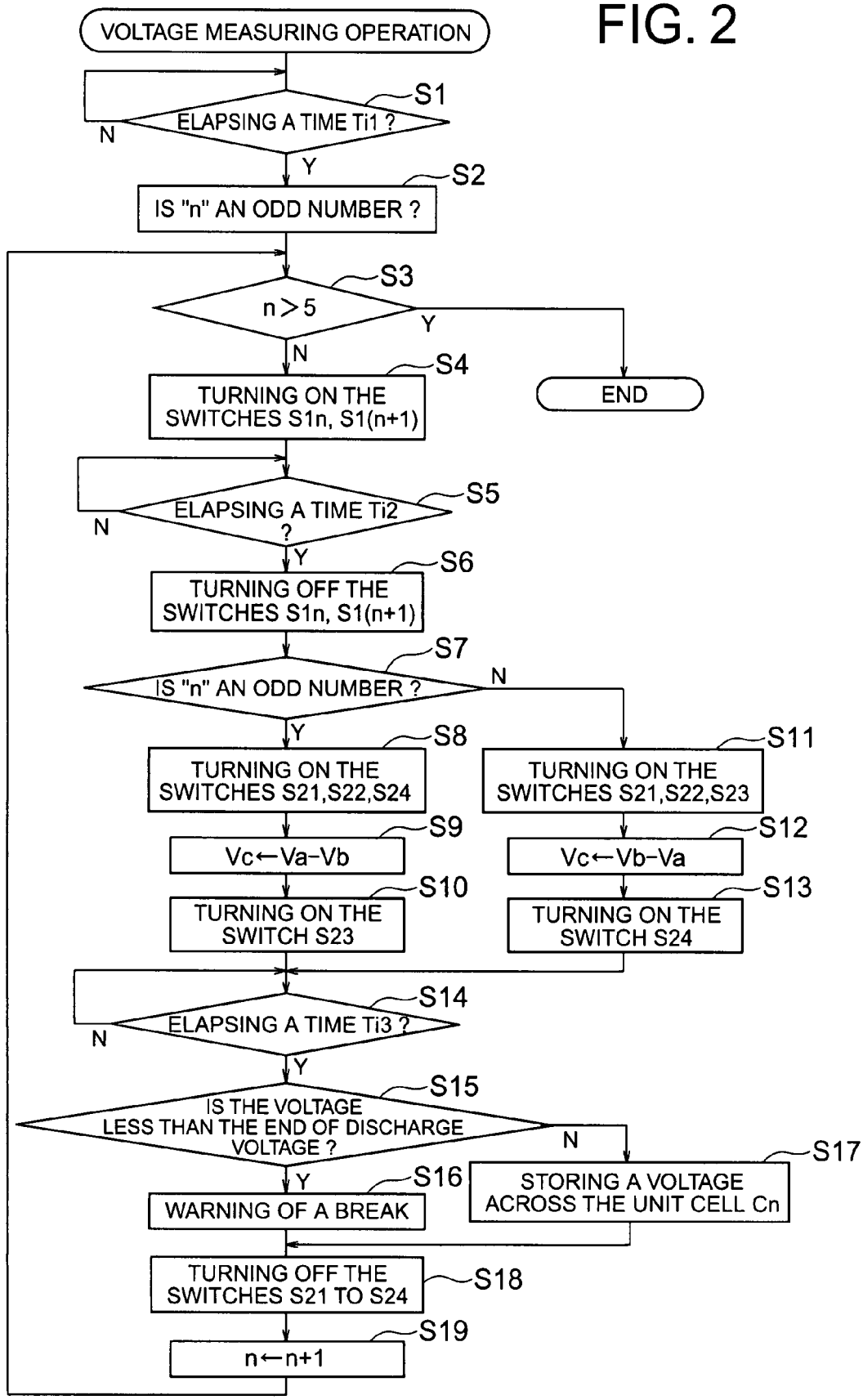
FIG. 2 is a flowchart showing a procedure of a CPU included in the voltage measuring device shown in FIG. 1 according to the first embodiment.
Figure 3:
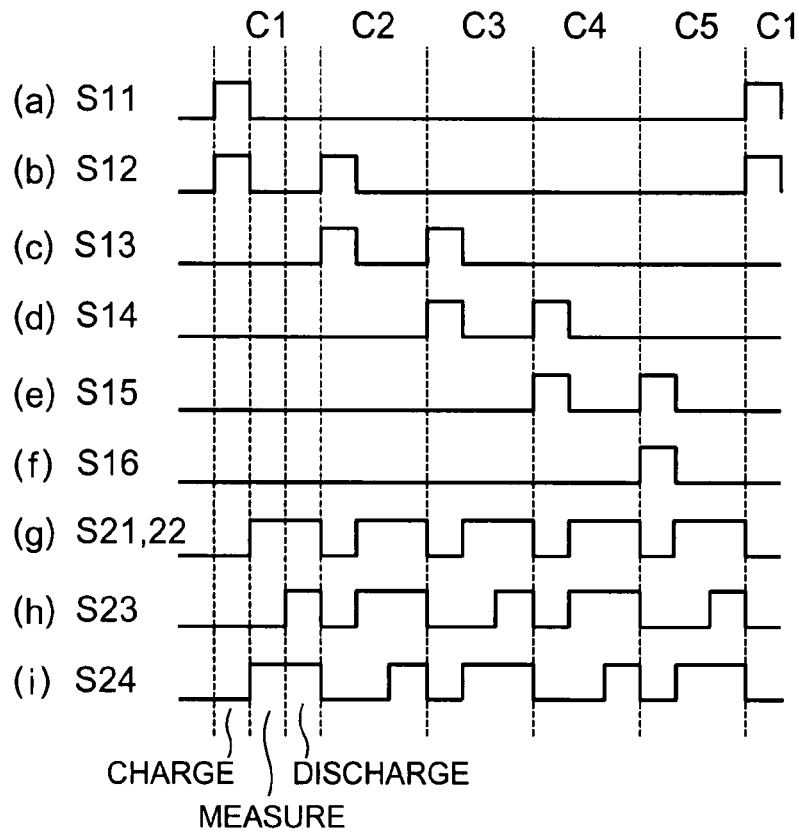
FIG. 3 is a timing diagram showing on/off states of selector switches and measuring switches included in the voltage measuring device shown in FIG. 1.

An operation of the voltage measuring device 10 will be explained with reference to a flowchart showing a procedure of the CPU 12a in FIG. 2, and a timing diagram showing on/off states of the selector switches S11 to S16 and the measuring switches S21 to S24 in FIG. 3. The CPU 12 starts a voltage measuring operation after an ignition switch is off. First, the CPU 12a wait for a specific time Ti1 until the voltage across the high voltage battery $B_H$ becomes stable after the ignition switch is off (step S1).

After the specific time has passed ("Y" in step S1), the CPU 12a sets a cell counter "n" to one (step S2). Then, the CPU 12a judges whether the cell counter "n" is more than five (step S3). If the cell counter "n" is more than 5 ("Y" in step S3), CPU 12a judges that voltages across all the unit cells C1 to C5 are measured, and the voltage measuring operation is ended.

If the cell counter "n" is not more than five ("N" in step S3), the CPU 12a turns on the selector switches S1n and S1(n+1) (step S4). Thus, the both terminals of the unit cell Cn are connected to the terminals of the capacitor C, and the unit cell Cn start charging the capacitor C. Then, after the CPU 12a waits for a specific time Ti2 ("Y" in step S5), the CPU 12a turns off the selector switches S1n and S1(n+1) (step S6). Thus, the unit cell Cn is separated from the capacitor C.

Incidentally, the charging time Ti2 is longer than a time to equalize the voltage across the capacitor to the voltage across the unit cell Cn. Therefore, in step S6, the voltage across the unit cell Cn is equal to the voltage across the capacitor C. As shown in FIG. 3(a) to 3(f), by repeating step S1 to S6, the selector switches S11 to S16 are sequentially on, and the unit cells C1 to C5 sequentially charge the capacitor C.

Next, the CPU 12a judges whether the cell counter "n" is an odd number or not (step S7). If the cell counter "n" is the odd number ("Y" in step S7), any one of the unit cells C1, C3, C5 charges the capacitor C, the terminal "a" is positive charged, and the terminal "b" is negative charged, and the CPU 12a turns on the measuring switches S21, S22, and S24 (step S8).

In step S8, the CPU 12a works as a first switching controller, only the terminal "b" of the capacitor C is grounded, and the terminals "a", "b" are respectively connected to the inputs T1, T2. When the terminal "a" of the capacitor C is connected to the input T1, the A/D converter 11c inputs a digital value of a voltage Va at the terminal "a" to the CPU 12a. On the other hand, when the terminal "b" of the capacitor C is connected to the input T2, the A/D converter 11d inputs a digital value of a voltage Vb at the terminal "b" to the CPU 12a.

Then, the CPU 12a calculates (Va−Vb) as a voltage Vc across the capacitor (step S9). Thus, in step S9, the CPU 12a works as a voltage measuring unit.

Next, the CPU 12a works as a third switching controller, and turns on the measuring switch S23 in addition to the switches S21, S22, S24 (step S10), then the process goes to step S14. Thus, both terminals of the capacitor C are grounded, and the charge charged in the capacitor C is discharged via the resistors R1, R2.

According to the operations in steps S8, S9, when the charge of the capacitor C by one of the odd number unit cells C1, C3, C5 is finished, the selector switches S11 to S16 are turned off, and the measuring switches S21, S22 are turned on so that the terminals "a", "b" of the capacitor C are respectively connected to the inputs T1, T2 (FIG. 3(g)). Further, the measuring switch S24 is turned on (FIG. 3(i)) so that the negative charged terminal "b" is grounded.

On the other hand, if the cell counter "n" is an even number ("N" in step S7), one of the odd number cells C2, C4 charges the capacitor C, the terminal "a" is negative charged, the terminal "b" is positive charged, and the CPU 12a turns on the measuring switches S21, S22, S23 (step s11).

In step S11, the CPU 12a works as a second switching controller, the terminal "a" is grounded, and the terminals "a", "b" are respectively connected to the inputs T1, T2. When the terminal "a" of the capacitor C is connected to the input T1, the A/D converter 11c inputs a digital value of a voltage Va at the terminal "a" to the CPU 12a. On the other hand, when the terminal "b" of the capacitor C is connected to the input T2, the A/D converter 11d inputs a digital value of a voltage Vb at the terminal "b" to the CPU 12a.

Then, the CPU 12a calculates (Vb−Va) as a voltage Vc across the capacitor (step S12). Thus, in step S12, the CPU 12a works as a voltage measuring unit.

According to the operations in steps S11, S12, when the charge of the capacitor C by one of the even number unit cells C2, C4 is finished, the selector switches S11 to S16 are turned off, and the measuring switches S21, S22 are turned on so that the terminals "a", "b" of the capacitor C are respectively connected to the inputs T1, T2 (FIG. 3(g)). Further, the measuring switch S23 is turned on (FIG. 3(h)) so that the negative charged terminal "a" is grounded.

Next, the CPU 12a works as a third switching controller, and turns on the measuring switch S24 in addition to the switches S21, S22, S23 (step S13), then the process goes to step S14. Thus, both terminals of the capacitor C are grounded, and the charge charged in the capacitor C is discharged via the resistors R1, R2. According to steps S10, S13, every time when the measurement of the voltage across the capacitor C is finished, the both terminals of the capacitor C is grounded to be discharged (FIG. 3(h), (i)).

In step S14, after the CPU 12a waits for a predetermined discharge time Ti3, the process goes to step S15. The discharge time Ti3 is set so that the voltage across the capacitor C which has been charged by the fully charged unit cells C1 to C5 is discharged to be less than an end of discharge voltage of the unit cells C1 to C5. The CPU 12a works as a failure detecting unit, and when the voltage across the capacitor in step S9, S12 is lower than the end of discharge voltage of the unit cells C1 to C5 ("Y" in step S15), the CPU 12a warns of a break (step S16) and the process goes to step S18.

On the other hand, when the voltage across the capacitor in step S9, S12 is not less than the end of discharge voltage of the unit cells C1 to C5 ("Y" in step S15), the CPU 12a stores the voltage across the capacitor as the voltage across the unit cell Cn in the RAM. Then, the process goes to step S18. In step S18, the CPU 12a turns off the switches S21 to S 24 to disconnect the capacitor C from the voltage measuring unit 11, then increments the cell counter "n"(step S19), and the process goes to step S3.

According to the voltage measuring device 10, a pair of measuring switches S23, S24 is interposed between the both terminals and the ground. When the terminal "a" is positive charged, the terminal "b" is grounded and the terminals "a", "b" are respectively connected to the input terminals T1, T2. When the terminal "b" is positive charged, the terminal "a" is grounded and the terminals "a", "b" are respectively connected to the input terminals T1, T2. Therefore, when the capacitor C is connected to the voltage measuring unit 11, a negative voltage is not applied to the voltage measuring unit 11. Further, high voltage switches are not needed for the measuring switches S21 to S24. Therefore, a cost of the voltage measuring device 10 can be reduced.

Further, according to the voltage measuring device 10, the voltage measuring unit 11 includes two input terminals T1, T2 and two A/D converters 11c, 11d for A/D converting the voltages inputted to the input terminals T1, T2. Therefore, reversing the polarity of the capacitor is not needed for connecting to the input terminals T1, T2, and switches for reversing the polarity are not needed. Therefore, the cost of the voltage measuring device 10 can be reduced.

Further, according to the voltage measuring device 10, while the CPU 12a turns on the measuring switches S21, S22, S24, the CPU 12a measures the voltage across the capacitor C by subtracting the voltage Vb inputted to the input terminal T2 from the voltage Va inputted from the input terminal T1. On the other hand, while the CPU 12a turns on the measuring switches S21, S22, S23, the CPU 12a measures the voltage across the capacitor C by subtracting the voltage Va inputted to the input terminal T1 from the voltage Vb inputted from the input terminal T2. Therefore, the voltage across the capacitor C is correctly measured.

Further, after the CPU 12a measures the voltage across the capacitor C in step S9 and S12, the CPU 12 controls the measuring switches S21 to S24 to ground the both terminals of the capacitor C to discharge the capacitor C (step S10 and S13). Therefore, the measuring switches S21 to S24 for connecting the capacitor C to the voltage measuring unit 11 are also used for discharging the capacitor. Therefore, the cost of the voltage measuring device 10 can be reduced.

Figure 4:
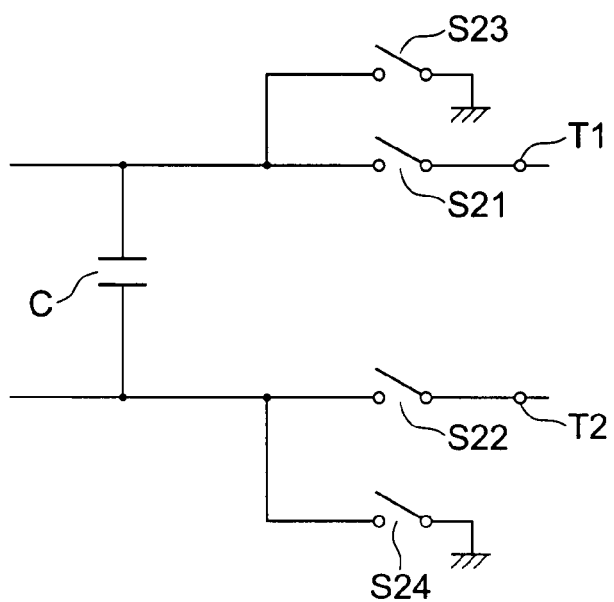
FIG. 4 is a partial circuit diagram showing the voltage measuring device according to another embodiment.

Incidentally, according to the first embodiment, the measuring switches S21, S22 are connected to the capacitor C, and the measuring switches S23, S24 are connected to the measuring switches S21, S22 via the resistors R1, R2. However, the present invention is not limited to this. For example, as shown in FIG. 4, the measuring switches S21, S22 may be directly connected to the voltage measuring circuit 11, and the measuring switches S23, S24 may be directly connected to the capacitor C.

Further, the method for calculating the capacitor C from the voltages applied to the inputs T1, T2 is not limited to the first embodiment. For example, the grounded voltage of the voltages Va, Vb is zero volt. Therefore, in step S9, the voltage Va applied to the input T1 may be measured as the voltage Vc across the capacitor C. Also, in step S12, the voltage Vb applied to the input T2 may be measured as the voltage Vc across the capacitor C.

Further, in the first embodiment, the break is detected by comparing the end of discharge voltage with the previously measured voltage Vc across the capacitor C after discharging the voltage across the capacitor C (step S15). However, the present invention is not limited to this. The break may be detected at any time between the end of the measurement of the voltage Vc across the capacitor C and the start of the measurement of the voltage Vc charged by the next unit cell, or may be detected after measuring the voltages across all the unit cells C1 to C5.

Second Embodiment

Figure 5:
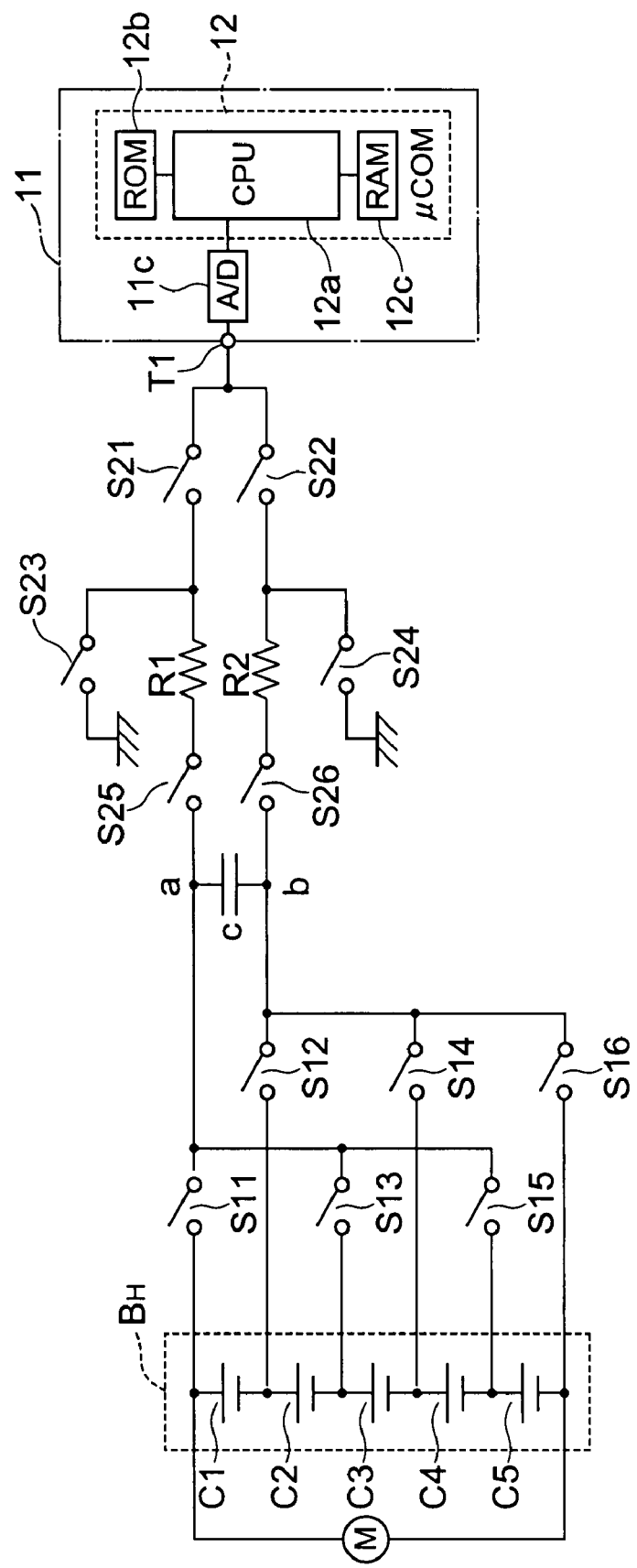
FIG. 5 is a circuit diagram showing a second embodiment of the voltage measuring device according to the present invention.

Next, a second embodiment of the present invention will be explained with reference to figures. FIG. 5 is a circuit diagram showing the voltage measuring device according to the second embodiment of the present invention.

The voltage measuring device 10 includes a pair of measuring switches S21, S22 (a pair of first switching members) interposed between the resistors R1, R2 and the input T1, and a pair of measuring switches S23, S24 interposed between the resistors R1, R2 and the ground. The pair of measuring switches S21, S22 is connected to the voltage measuring circuit 11 via the input T1.

Further, a pair of measuring switches S25, S26 is interposed between the resistors R1, R2 and the terminals "a", "b" of the capacitor C. In the second embodiment, the pair of measuring switches S25, S26 is provided, however, they do not have to be provided.

The pair of measuring switches S25, S26 is connected to the common input T1 via the resistors R1, R2 and the switches S21, S22. The A/D converter 11c A/D converts the voltage applied to the input T1 and outputs to the CPU 12a.

Figure 6:
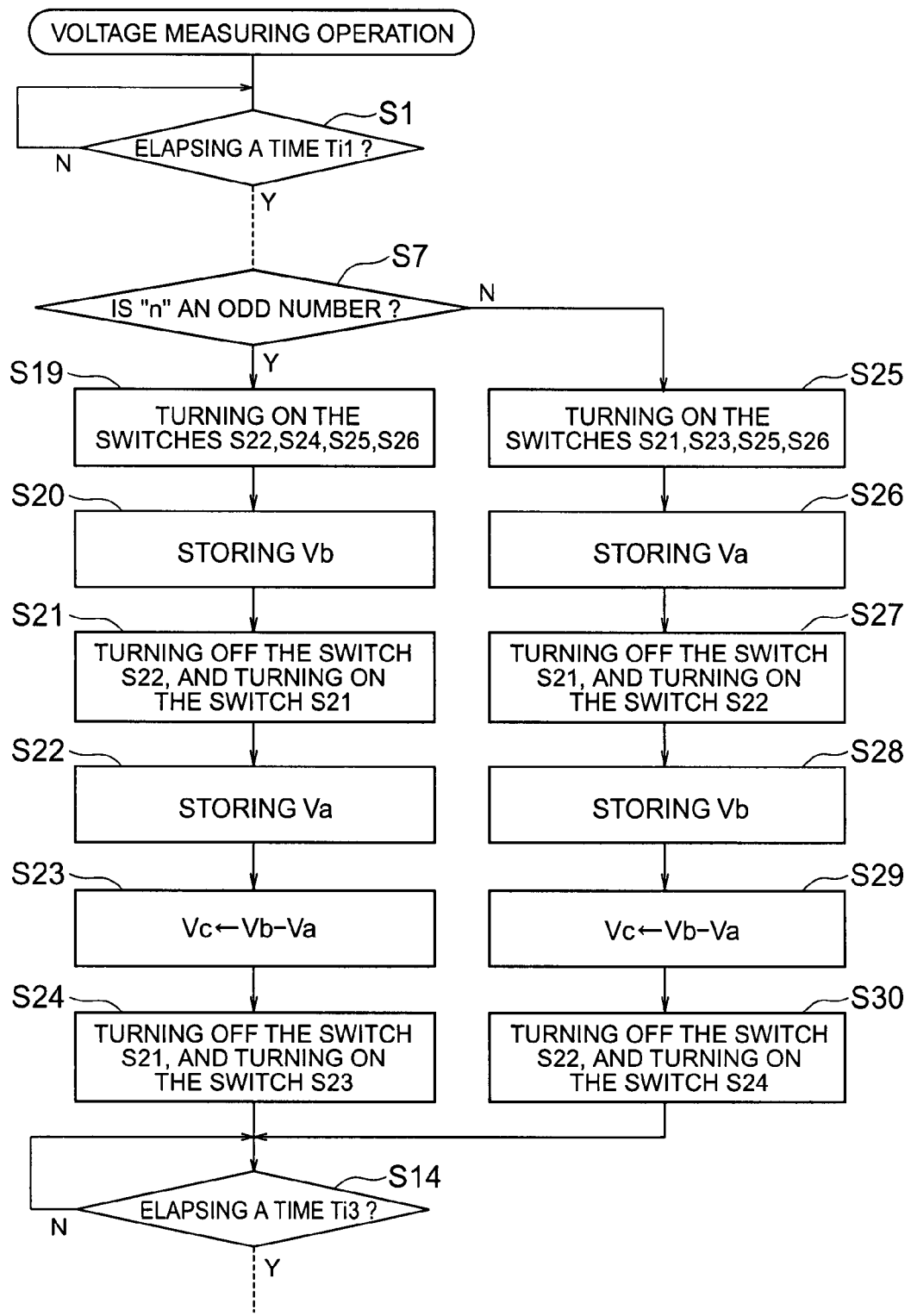
FIG. 6 is a flowchart showing a procedure of a CPU included in the voltage measuring device shown in FIG. 5 according to the second embodiment.
Figure 7:
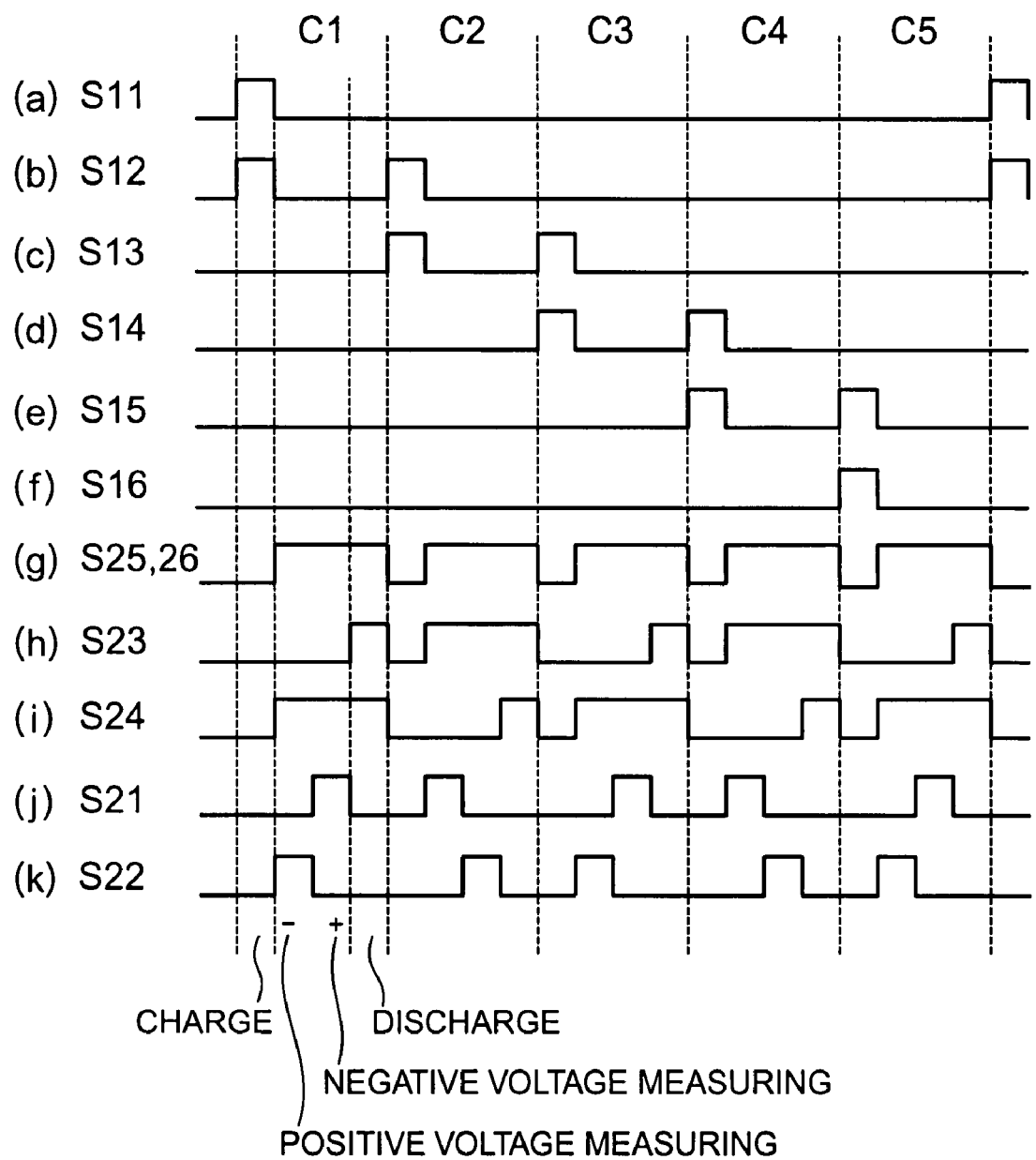
FIG. 7 is a timing diagram showing on/off states of selector switches and measuring switches included in the voltage measuring device shown in FIG. 5 according to the second embodiment.

An operation of the voltage measuring device 10 will be explained with reference to a flowchart of the CPU 12a shown in FIG. 6, and a timing diagram shown in FIG. 7, showing on/off states of the selector switches S11 to 16 and the measuring switches S21 to S26. In FIG. 6, steps equal to the steps in the first embodiment shown in FIG. 2 are indicated by the same reference symbols, and explanations thereof are omitted. After the ignition switch turns off, the CPU 12a starts measuring the voltages of the unit cells. First, the CPU 12a goes to steps S1 to S7. These steps S1 to S7 are the same as the steps S1 to S7 in the first embodiment, so explanations of those are omitted.

In step S7, when the cell counter "n" is an odd number ("Y" in step S7), the terminal "a" is positive charged, and the terminal "b" is negative charged, so that the CPU 12a turns on the measuring switches S22, S24, S25, S26 (step S19).

In the step S19, the terminal "b" is connected to both the input T1 and the ground. When the terminal "b" is connected to the input T1, the A/D converter 11c inputs a digital value of the voltage Vb at the terminal "b" into the CPU 12a. The CPU 12a stores the RAM 12c with the voltage Vb (step S20).

Next, the CPU 12a turns off the measuring switch S22, and turns on the measuring switch S21 (step S21). At this time, the measuring switches S24, S25, S26 are kept on. In the step S21, the terminal "a" of the capacitor C is connected to the input T1. The terminal "b" is kept grounded. When the terminal "a" is connected to the input T1, the A/D converter 11c inputs a digital value of the voltage Va at the terminal "a" into the CPU 12a. The CPU 12a stores the RAM 12c with the voltage Va (step S22).

In the steps S19 and S21, the CPU 12a works as the first switching controller, and controls the measuring switches S21 to S26 so that after the odd number unit cells C1, C3, C5 charges the capacitor C, while the terminal "b" is grounded, the terminals "a" and "b" are alternately connected to the input T1 (see FIG. 7).

Next, the CPU 12a works as the voltage measuring unit, and calculates the voltage Vc across the capacitor C by subtracting the voltage Vb from the voltage Va (step S23). Next, the CPU 12a works as the third switching controller, turns off the measuring switch S21 and turns on the measuring switch S23 (step S24). Then, the process goes to step S14. Thus, both terminals of the capacitor C are grounded via the resistors R1, R2, and the capacitor C is discharged.

On the other hand, when the cell counter "n" is an even number ("N" in step S7), the terminal "a" is negative charged, and the terminal "b" is positive charged, so that the CPU 12a turns on the measuring switches S21, S23, S25, S26 (step S25).

In the step S25, the terminal "a" is connected to both the input T1 and the ground. When the terminal "a" is connected to the input T1, the A/D converter 11c inputs a digital value of the voltage Va at the terminal "a" into the CPU 12a. The CPU 12a stores the RAM 12c with the voltage Va (step S26).

Next, the CPU 12a turns off the measuring switch S21, and turns on the measuring switch S22 (step S27). At this time, the measuring switches S23, S25, S26 are kept on. In the step S27, the terminal "b" of the capacitor C is connected to the input T1. The terminal "a" is kept grounded. When the terminal "b" is connected to the input T1, the A/D converter 11c inputs a digital value of the voltage Vb at the terminal "b" into the CPU 12a. The CPU 12a stores the RAM 12c with the voltage Vb (step S28).

In the steps S25 and S27, the CPU 12a works as the second switching controller, and controls the measuring switches S21 to S26 so that after the even number unit cells C2, C4 charges the capacitor C, while the terminal "a" is grounded, the terminals "a" and "b" are alternately connected to the input T1 (see FIG. 7).

Next, the CPU 12a works as the voltage measuring unit, and calculates the voltage Vc across the capacitor C by subtracting the voltage Va from the voltage Vb (step S29). Next, the CPU 12a works as the third switching controller, turns off the measuring switch S22 and turns on the measuring switch S24 (step S30). Then, the process goes to step S14. Thus, both terminals of the capacitor C are grounded via the resistors R1, R2, and the capacitor C is discharged.

According to the voltage measuring device 10, the pair of measuring switches S21, S22 are connected between the pair of measuring switches S23, S24 and the common input T1 of the voltage measuring circuit 11. Thus, even when the input T1 of the A/D converter 11c is solely provided, the terminals "a", "b" are switched to be connected to the input T1 with the pair of measuring switches S21, S22. Therefore, the voltage measuring device 10 has only one input T1, and the cost of the voltage measuring device 10 can be reduced.

Further, according to the voltage measuring device 10, the voltage Va is measured while the terminal "a" is connected to the input T1, and the voltage Vb is measured while the terminal "b" is connected to the input T1. Therefore, the voltage Vc across the capacitor C can be correctly measured.

Incidentally, in the second embodiment, the negative charged terminal is firstly connected to the input T1. However, the present invention is not limited to this. The positive charged terminal may firstly connected to the input T1.

Third Embodiment

Next, a third embodiment of the present invention will be explained with reference to figures. The structure of the voltage measuring device 10 in the third embodiment is the same as that in the second embodiment, therefore the explanation thereof is omitted.

Figure 8:
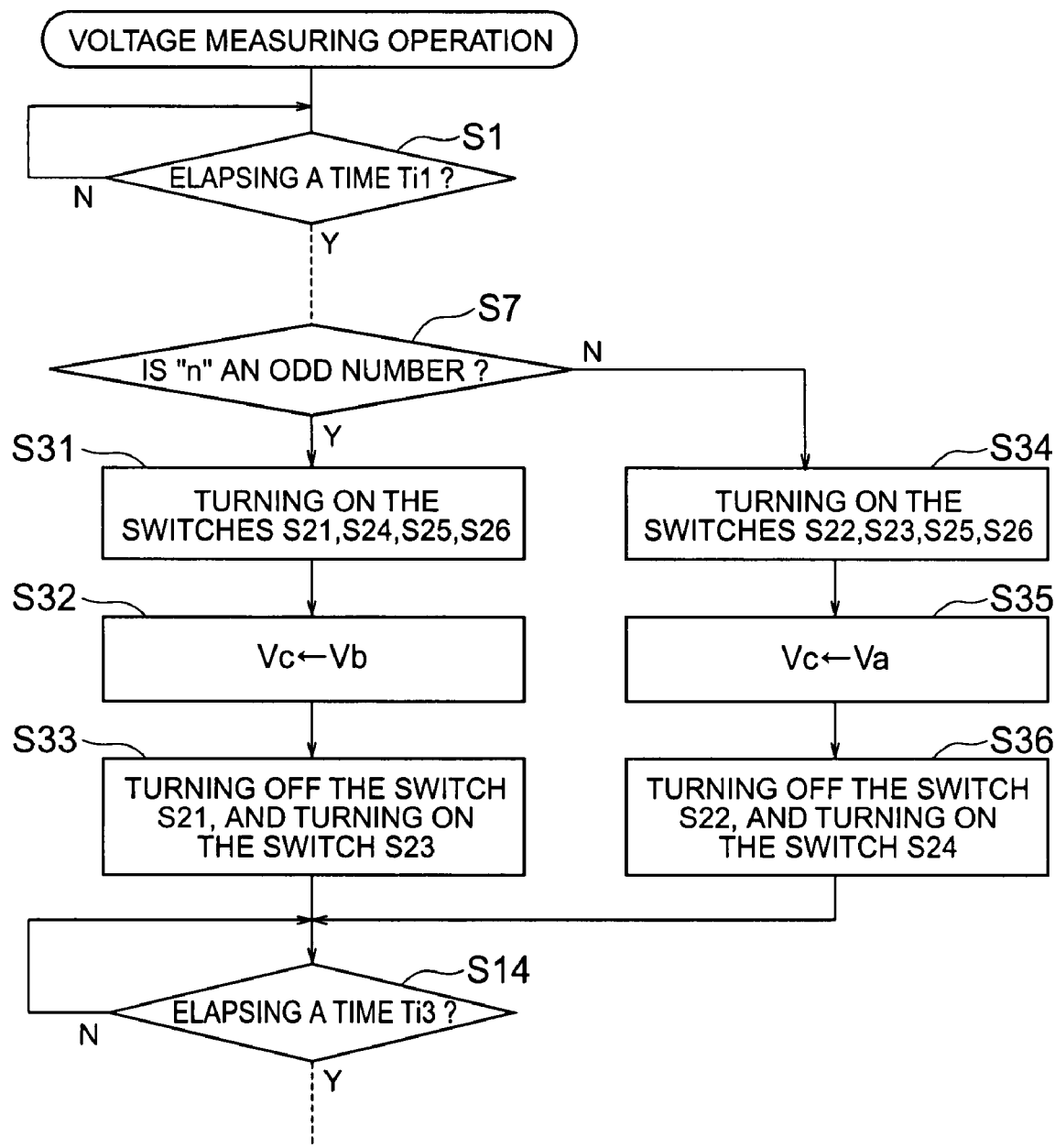
FIG. 8 is a flowchart showing a procedure of a CPU included in the voltage measuring device shown in FIG. 5 according to a third embodiment.
Figure 9:
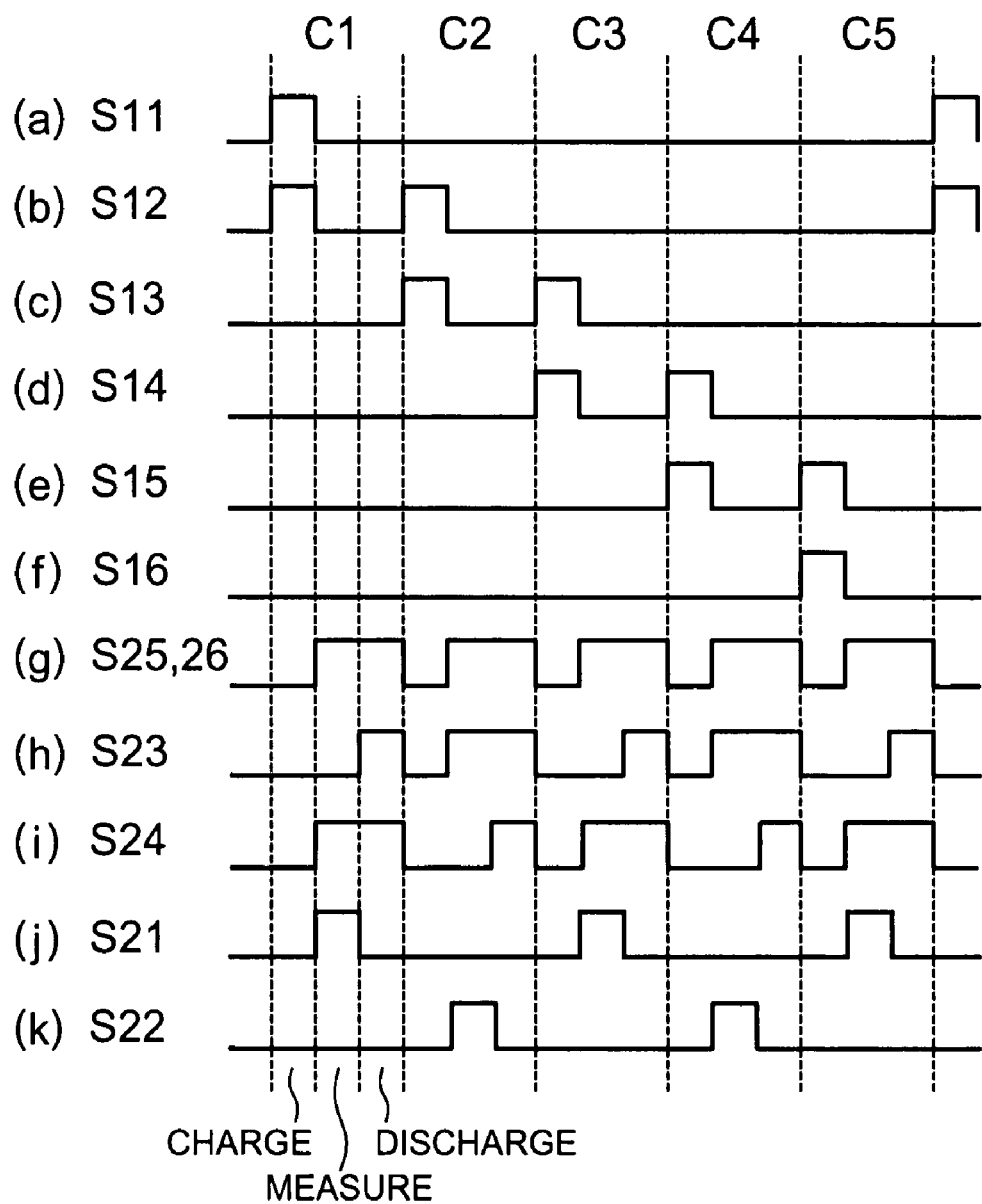
FIG. 9 is a timing diagram showing on/off states of selector switches and measuring switches included in the voltage measuring device shown in FIG. 5 according to the third embodiment.
Figure 10:
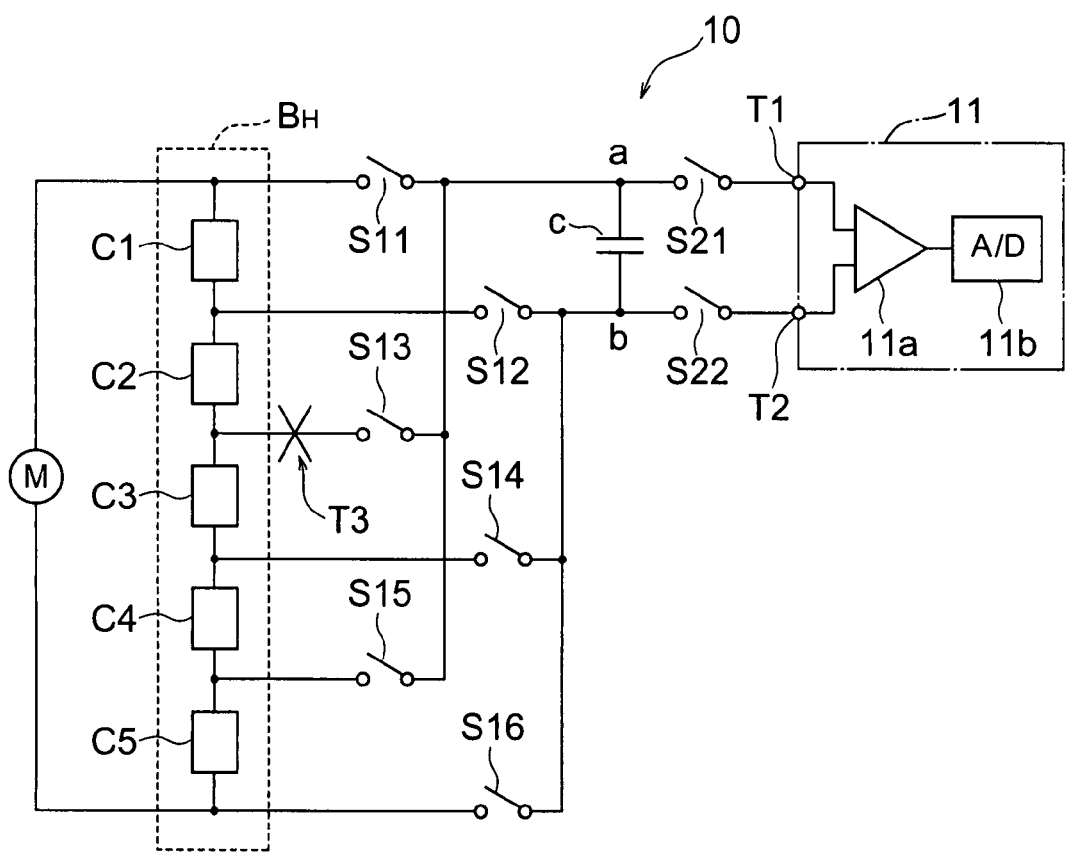
FIG. 10 is a circuit diagram showing a conventional voltage measuring device.
Figure 11:
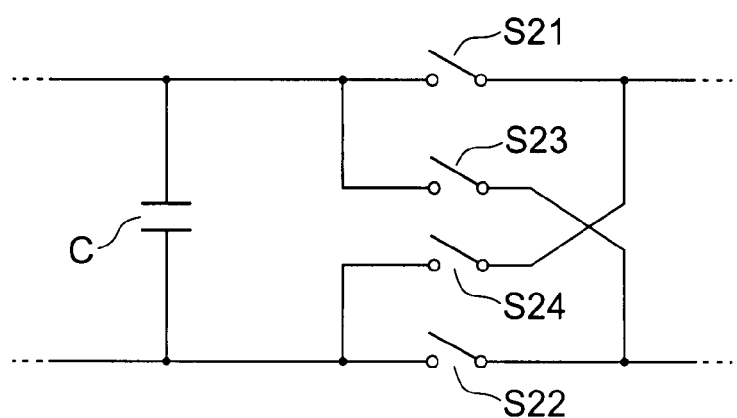
FIG. 11 is a circuit diagram showing a polarity selecting system.

An operation of the voltage measuring device 10 in the third embodiment will be explained with reference to a flowchart of the CPU 12a shown in FIG. 8, and a timing diagram shown in FIG. 9, showing on/off states of the selector switches S11 to S16 and the measuring switches S21 to S26. In FIG. 8, the steps equal to the steps in the first and the second embodiments are indicated by the same reference symbols, and the explanations thereof are omitted. After the ignition switch turns off, the CPU 12a starts measuring the voltages of the unit cells. First, the CPU 12a goes to steps S1 to S7. These steps S1 to S7 are the same as those in the first embodiment, so explanations of those are omitted.

In step S7, when the cell counter "n" is an odd number ("Y" in step S7), the terminal "a" is positive charged, and the terminal "b" is negative charged, so that the CPU 12a turns on the measuring switches S21, S24, S25, S26 (step S31).

In the step S31, the terminal "b" is grounded, and the terminal "a" is connected to the input T1. When the terminal "a" is connected to the input T1, the A/D converter 11c inputs a digital value of the voltage Va at the terminal "a" into the CPU 12a. The CPU 12a treats the voltage Va inputted from the A/D converter 11c as the voltage Vc across the capacitor C, because the voltage Vb at the terminal "b" is zero volt (step S32). Then, the CPU 12a turns off the measuring switch S21 and turns on the measuring switch S23 (step S33), so that both terminals of the capacitor C are grounded to discharge the capacitor. Then, the process goes to step S14.

According to the steps S31 and S32, when the capacitor C is charged by the odd number unit cell C1, C3, or C5, the negative charged terminal "b" is grounded, and the positive charged terminal "a" is connected to the input T1 (see FIG. 9).

On the other hand, when the cell counter "n" is the even number ("N" in step S7), the terminal "b" is positive charged, and the terminal "a" is negative charged. The CPU 12a turns on the measuring switches S22, S23, S25, and S26 (step S34).

In the step S34, the terminal "a" is grounded, and the terminal "b" is connected to the input T1. When the terminal "b" is connected to the input T1, the A/D converter 11c inputs a digital value of the voltage Vb at the terminal "b" into the CPU 12a. The CPU 12a treats the voltage Vb inputted from the A/D converter 11c as the voltage Vc across the capacitor C, because the voltage Va at the terminal "a" is zero volt (step S35). Then, the CPU 12a turns off the measuring switch S22 and turns on the measuring switch S24 (step S36), so that both terminals of the capacitor C are grounded to discharge the capacitor. Then, the process goes to step S14. The operations in the steps S14 and so on are the same as those in the first embodiment, and the explanations of those are omitted.

According to the steps S34 and S35, when the capacitor C is charged by the even number unit cell C2, or C4, the negative charged terminal "a" is grounded, and the positive charged terminal "b" is connected to the input T1 (see FIG. 9).

According to the voltage measuring device 10, only the positive charged terminal is connected to the input T1. The CPU 12c measures the voltage inputted from the A/D converter 11c as the voltage across the capacitor C. Therefore, both terminals are not alternately connected to the input T1 like the second embodiment. Accordingly, a measuring time of the voltage measuring device 10 can be reduced.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A voltage measuring device comprising:
    a capacitor sequentially connected to a plurality of unit cells connected in series, and charged in positive and negative polarities depending on the unit cells;
    a voltage measuring unit for measuring a voltage across the capacitor, said voltage measuring unit having a first and a second input terminal, wherein a differential voltage between the first and the second input terminals determines a voltage across the capacitor;
    a pair of first switches, each switch having a controllable connecting means for either connecting or not connecting a first terminal and a second terminal of the switch, wherein, when the connecting means is not connecting, the first terminals of the first switches are respectively connected to first and second terminals of the capacitor and the second terminals of the first switches are respectively connected to the first and second input terminals of the voltage measuring unit;
    a pair of second switches, each switch having a controllable connecting means for either connecting or not connecting a first terminal and a second terminal of the switch, wherein, when the connecting means is not connecting, the first terminals of the second switches are respectively connected to the first and the second input terminals and the second terminals of the second switches are connected to a ground;

a first switching controller for controlling the first and second switches so that when a first terminal of the capacitor is positive charged, while a second terminal of the capacitor is grounded, at least the first terminal of the capacitor is connected to one of the input terminals;

a second switching controller for controlling the first and second switches so that when the second terminal of the capacitor is positive charged, while the first terminal is grounded, at least the second terminal of the capacitor is connected to one of the input terminals.

2. The device as claimed in claim 1, wherein the voltage measuring unit includes two analog/digital converters for respectively analog/digital converting voltages inputted from the two input terminals, the first terminal of one of the first switches is connected to the first terminal of the capacitor, the second terminal of the one of the first switches is connected to the first input terminal, the first terminal of the other one of the first switches is connected to the second terminal of the capacitor, and the second terminal of the other one of the first switches is connected to the second input terminal.

3. The device as claimed in claim 1, wherein the first switching controller controls the first and second switches so that while the second terminal of the capacitor is grounded, both terminals of the capacitor are respectively connected to the two input terminals, and the second switching controller controls the first and second switches so that while the first terminal of the capacitor is grounded, both terminals of the capacitor are respectively connected to the two input terminals, wherein the voltage measuring unit measures a difference by subtracting a voltage applied to the second input terminal from a voltage applied to the first input terminal as a voltage across the capacitor while the first switching control controls the first and the second switches, and measures a difference by subtracting a voltage applied to the first input terminal from a voltage applied to the second input terminal as a voltage across the capacitor while the second switching controller controls the first and the second switches.

4. The device as claimed in claim 1, wherein the voltage measuring unit includes an analog/digital converter for analog/digital converting the voltage applied to the input terminal, the first terminals of the pair of the first switches are connected to the capacitor, the second terminals of the first switches are connected to a common input terminal of the voltage measuring unit, the first terminals of the second switches are respectively connected to the first and second terminals of the capacitor, and the second terminals of the second switches are connected to the ground.

5. The device as claimed in claim 4, wherein the first switching controller controls the first and second switches so that while the second terminal of the capacitor is grounded, the first and second terminals of the capacitor are alternately connected to the input terminal, and the second switching controller controls the first and second switches so that while the first terminal of the capacitor is grounded, the first and second terminals of the capacitor are alternately connected to the input terminal, wherein the voltage measuring unit measures a differential voltage by subtracting a voltage applied to the input terminal while the second terminal of the capacitor is connected to the input terminal from a voltage applied to the input terminal while the first terminal of the capacitor is connected to the input terminal as a voltage across the capacitor while the first switching controller controls the first and the second switches, and measures a differential voltage by subtracting a voltage applied to the input terminal while the first terminal of the capacitor is connected to the input terminal from a voltage applied to the input terminal while the second terminal of the capacitor is connected to the input terminal as a voltage across the capacitor while the second switching controller controls the first and the second switches.

6. The device as claimed in claim 4, wherein the first switching controller controls the first and second switches so that while the second terminal of the capacitor is grounded, the first terminal of the capacitor is connected to the input terminal, and the second switching controller controls the first and second switches so that while the first terminal of the capacitor is grounded, the second terminal of the capacitor is connected to the input terminal, wherein the voltage measuring unit measures a voltage applied to the input terminal while the first and second switching controllers control the switches as a voltage across the capacitor.

7. A voltage measuring device comprising:

a capacitor sequentially connected to a plurality of unit cells connected in series, and charged in positive and negative polarities depending on the unit cells;

a voltage measuring unit for measuring a voltage across the capacitor said voltage measuring unit having a first and a second input terminal, wherein a differential voltage between the first and the second input terminals determines a voltage across the capacitor;

a pair of first switches of which first terminals are respectively connected to first and second terminals of the capacitor and second terminals of the first switches are respectively connected to the first and second input terminals of the voltage measuring unit;

a pair of second switches of which first terminals are respectively connected to the first and the second input terminals and second terminals of the second switches are connected to a ground;

a first switching controller for controlling the first and second switches so that when a first terminal of the capacitor is positive charged, while a second terminal of the capacitor is grounded, at least the first terminal of the capacitor is connected to one of the input terminals;

a second switching controller for controlling the first and second switches so that when the second terminal of the capacitor is positive charged, while the first terminal is grounded, at least the second terminal of the capacitor is connected to one of the input terminals, wherein the voltage measuring device further includes a third switching controller for controlling the first and second switches to discharge the capacitor by grounding the both terminals of the capacitor after the voltage measuring unit measures the voltage across the capacitor, and a failure detecting unit for detecting a break in a connector connecting any two of the plurality of unit cells connected in series based on the voltage across the capacitor measured by the voltage measuring unit.

* * * * *